(12) United States Patent
Lai et al.

(10) Patent No.: US 9,190,347 B2
(45) Date of Patent: Nov. 17, 2015

(54) DIE EDGE CONTACTS FOR SEMICONDUCTOR DEVICES

(71) Applicant: Taiwan Semiconductor Manufacturing Company, Ltd., Hsin-Chu (TW)

(72) Inventors: Yi-Jen Lai, Chang Hua (TW); You-Hua Chou, Hsin-Chu (TW); Hon-Lin Huang, Hsin-Chu (TW); Huai-Tei Yang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/967,165

(22) Filed: Aug. 14, 2013

(65) Prior Publication Data

US 2013/0328215 A1 Dec. 12, 2013

Related U.S. Application Data

(62) Division of application No. 12/874,816, filed on Sep. 2, 2010, now Pat. No. 8,541,262.

(51) Int. Cl.
*H01L 23/48* (2006.01)
*H01L 21/768* (2006.01)
(Continued)

(52) U.S. Cl.
CPC ........ *H01L 23/481* (2013.01); *H01L 21/76898* (2013.01); *H01L 24/05* (2013.01); *H01L 25/0657* (2013.01); *H01L 25/50* (2013.01); *H01L 24/03* (2013.01); *H01L 25/18* (2013.01); *H01L 2224/03823* (2013.01); *H01L 2224/03825* (2013.01); *H01L 2224/0401* (2013.01); *H01L 2224/05006* (2013.01); *H01L 2224/05009* (2013.01); *H01L 2224/0557* (2013.01); *H01L 2224/05147* (2013.01); *H01L 2224/05568* (2013.01); *H01L 2224/05655* (2013.01); *H01L 2225/06541* (2013.01); *H01L 2225/06551* (2013.01); *H01L 2225/06565* (2013.01); *H01L 2924/00014* (2013.01);
(Continued)

(58) Field of Classification Search
CPC .............. H01L 23/5226; H01L 23/481; H01L 2924/01078; H01L 2924/01079; H01L 2924/01029
USPC ......................................................... 257/774
See application file for complete search history.

(56) References Cited

U.S. PATENT DOCUMENTS

4,811,082 A 3/1989 Jacobs et al.
4,990,462 A 2/1991 Sliwa, Jr.
(Continued)

*Primary Examiner* — Monica D Harrison
(74) *Attorney, Agent, or Firm* — Slater & Matsil, L.L.P.

(57) ABSTRACT

A semiconductor device utilizing die edge contacts is provided. An integrated circuit die has a post-passivation layer with a trench filled with a conductive material extending from a contact to a die edge, thereby forming a die edge contact. Optionally, a through substrate via may be positioned along the die edge such that the conductive material in the trench is electrically coupled to the through-substrate via, thereby forming a larger die edge contact. The integrated circuit die may be placed in a multi-die package wherein the multi-die package includes walls having a major surface perpendicular to a major surface of the integrated circuit die. The die edge contacts are electrically coupled to contacts on the walls of the multi-die package. The multi-die package may include edge contacts for connecting to another substrate, such as a printed circuit board, a packaging substrate, a high-density interconnect, or the like.

20 Claims, 12 Drawing Sheets

(51) Int. Cl.
   *H01L 25/065* (2006.01)
   *H01L 25/00* (2006.01)
   *H01L 23/00* (2006.01)
   *H01L 25/18* (2006.01)

(52) U.S. Cl.
   CPC .. *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01019* (2013.01); *H01L 2924/01029* (2013.01); *H01L 2924/01033* (2013.01); *H01L 2924/01047* (2013.01); *H01L 2924/01073* (2013.01); *H01L 2924/01074* (2013.01); *H01L 2924/01075* (2013.01); *H01L 2924/01078* (2013.01); *H01L 2924/01079* (2013.01); *H01L 2924/01327* (2013.01); *H01L 2924/1434* (2013.01); *H01L 2924/15787* (2013.01); *H01L 2924/15788* (2013.01); *H01L 2924/351* (2013.01)

(56) References Cited

U.S. PATENT DOCUMENTS

| | | |
|---|---|---|
| 5,075,253 A | 12/1991 | Sliwa, Jr. |
| 5,356,838 A | 10/1994 | Kim |
| 5,380,681 A | 1/1995 | Hsu |
| 5,481,133 A | 1/1996 | Hsu |
| 5,990,566 A | 11/1999 | Farnworth et al. |
| 6,002,177 A | 12/1999 | Gaynes et al. |
| 6,034,438 A | 3/2000 | Petersen |
| 6,187,678 B1 | 2/2001 | Gaynes et al. |
| 6,236,115 B1 | 5/2001 | Gaynes et al. |
| 6,252,302 B1 | 6/2001 | Farnworth |
| 6,287,949 B1 | 9/2001 | Mori et al. |
| 6,355,501 B1 | 3/2002 | Fung et al. |
| 6,391,685 B1 | 5/2002 | Hikita et al. |
| 6,434,016 B2 | 8/2002 | Zeng et al. |
| 6,448,661 B1 | 9/2002 | Kim et al. |
| 6,562,653 B1 | 5/2003 | Ma et al. |
| 6,570,248 B1 | 5/2003 | Ahn et al. |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,894,386 B2 | 5/2005 | Poo et al. |
| 6,946,384 B2 | 9/2005 | Kloster et al. |
| 7,056,807 B2 | 6/2006 | Kellar et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,317,256 B2 | 1/2008 | William et al. |
| 7,320,928 B2 | 1/2008 | Kloster et al. |
| 7,345,350 B2 | 3/2008 | Sinha |
| 7,375,009 B2 | 5/2008 | Chua et al. |
| 7,402,442 B2 | 7/2008 | Condorelli et al. |
| 7,402,515 B2 | 7/2008 | Arana et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,576,435 B2 | 8/2009 | Chao |
| 7,834,450 B2 | 11/2010 | Kang |
| 7,863,722 B2 | 1/2011 | Chua |
| 2008/0067675 A1 | 3/2008 | Jeung et al. |
| 2009/0230528 A1 | 9/2009 | McElrea et al. |
| 2010/0225006 A1* | 9/2010 | Haba et al. ............ 257/774 |
| 2012/0007154 A1* | 1/2012 | Lin et al. ............... 257/288 |

* cited by examiner

DIE EDGE CONTACTS FOR SEMICONDUCTOR DEVICES

This application claims the benefit of U.S. application Ser. No. 12/874,816, filed Sep. 2, 2010, entitled, "Die Edge Contacts for Semiconductor Devices," which application is hereby incorporated herein by reference.

TECHNICAL FIELD

This disclosure relates generally to semiconductor devices and, more particularly, to semiconductor devices having die edge contacts.

BACKGROUND

Since the invention of the integrated circuit (IC), the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allow more components to be integrated into a given area.

The past few decades have also seen many shifts in semiconductor packaging that have impacted the entire semiconductor industry. The introduction of surface-mount technology (SMT) and ball grid array (BGA) packages were generally important steps for high-throughput assembly of a wide variety of IC devices, while at the same time allowing for reduction of the pad pitch on the printed circuit board. Conventionally packaged ICs have a structure basically interconnected by fine gold wire between metal pads on the die and electrodes spreading out of molded resin packages. On the other hand, some chip scale packages (CSP) or BGA packages rely on bumps/balls of solder to provide an electrical connection between contacts on the die and contacts on a substrate, such as a packaging substrate, a printed circuit board (PCB), another die/wafer, or the like. Other CSP or BGA packages utilize a solder ball or bump placed onto a conductive pillar, relying on the soldered joint for structural integrity. An underfill material is also typically placed between the IC and the underlying substrate, e.g., packaging substrate, to provide mechanical strength and to protect the IC from environmental contaminants.

In these embodiments, the point of electrical contact between the various substrates is the solder bump. The use of different substrates often means a difference in respective coefficients of thermal expansion (CTE). Due to this difference, the various substrates may expand/contract at different rates as the devices experience temperature cycles. This can create excessive amounts of stress in the joint region that may cause the joint to crack and/or cause other problems, such as delamination issues.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2A-5B illustrate various intermediate stages of a method of forming a semiconductor device in accordance with an embodiment;

FIGS. 7A-9B illustrate various intermediate stages of a method of forming a semiconductor device in accordance with an embodiment;

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Figure 1:
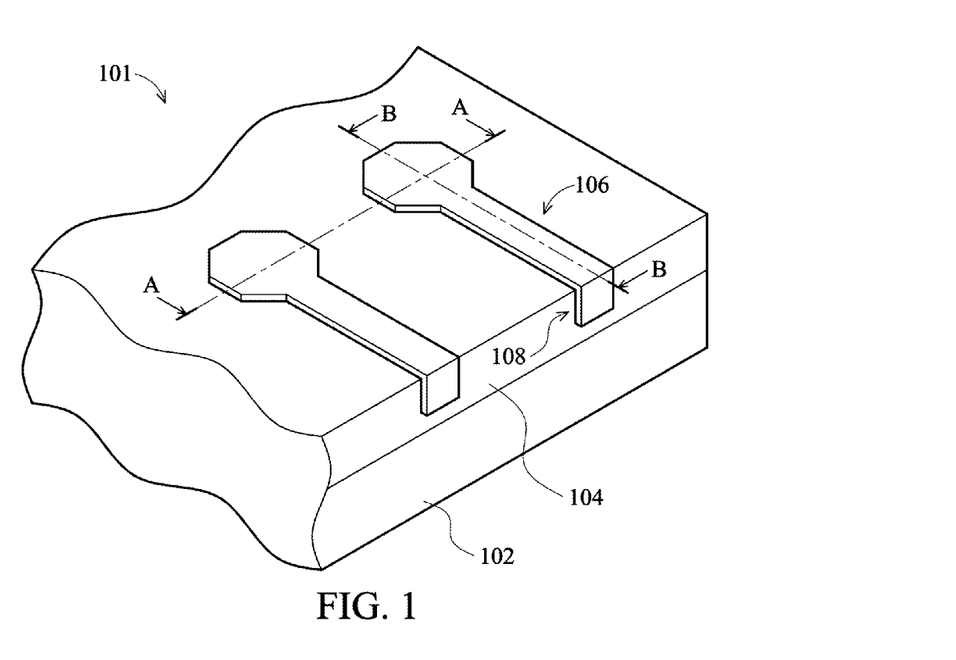
FIG. 1 is a perspective view of an integrated circuit die having die edge contacts in accordance with an embodiment.

FIG. 1 is a perspective view of a portion of a die 101 in accordance with an embodiment. The die 101 includes a substrate 102 having a passivation layer 104 formed thereon. The passivation layer 104 has traces 106, e.g., a post-passivation layer, formed therein. As will be explained in greater detail below, the traces 106 extend from an underlying contact (not shown in FIG. 1) to a die edge. The traces 106 are exposed on the die edge, thereby forming die edge contacts 108.

FIGS. 2A-5B illustrate various intermediate views of a method of forming a structure such as that illustrated in FIG. 1 in accordance with an embodiment. The "A" Figures of FIGS. 2A-5A are taken along the A-A line of FIG. 1, and the "B" Figures of FIGS. 2B-5B are taken along the B-B line of FIG. 1. It should be noted that the "B" Figures illustrate two adjacent dies to better illustrate embodiments discussed herein, wherein a dotted line 201 represent a scribe line between the two adjacent dies.

Figure 2A:
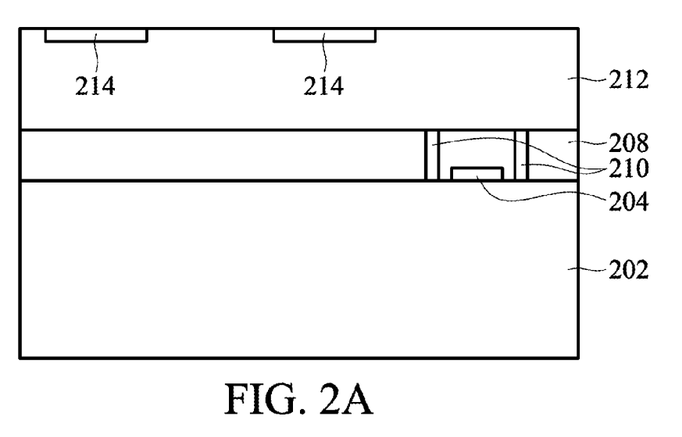
Figure 2B:
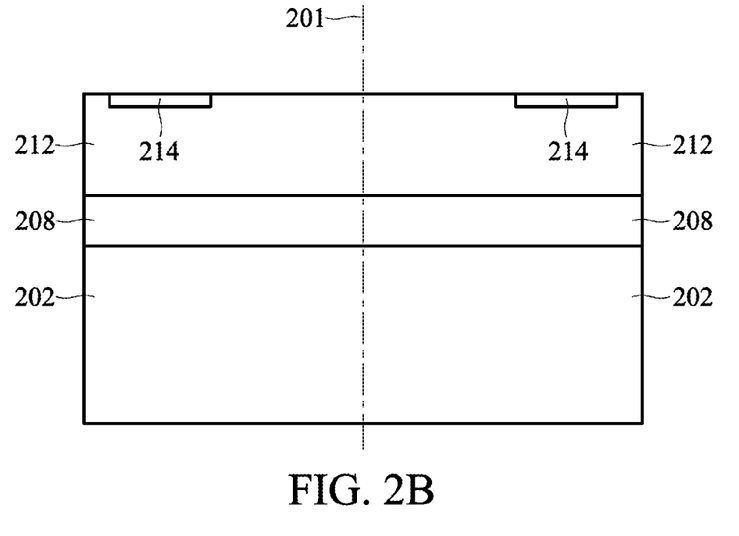

Referring first to FIGS. 2A and 2B, a portion of a substrate 202 having optional electrical circuitry 204 formed thereon is shown in accordance with an embodiment. The substrate 202 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The optional electrical circuitry 204 formed on the substrate 202 may be any type of circuitry suitable for a particular application. In an embodiment, the electrical circuitry 204 includes electrical devices formed on the substrate 202 with one or more dielectric layers overlying the electrical devices. Metal layers may be formed between dielectric layers to route electrical signals between the electrical devices. Electrical devices may also be formed in one or more dielectric layers.

For example, the electrical circuitry 204 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

An inter-layer dielectric (ILD) layer 208 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the ILD layer 208 may comprise a plurality of dielectric layers.

Contacts, such as contacts 210, are formed through the ILD layer 208 to provide an electrical contact to the electrical circuitry 204. The contacts 210 may be formed, for example, by using photolithography techniques to deposit and pattern a photoresist material on the ILD layer 208 to expose portions of the ILD layer 208 that are to become the contacts 210. An etch process, such as an anisotropic dry etch process, may be used to create openings in the ILD layer 208. The openings may be lined with a diffusion barrier layer and/or an adhesion layer (not shown), and filled with a conductive material. In an embodiment, the diffusion barrier layer comprises one or more layers of TaN, Ta, TiN, Ti, CoW, or the like, and the conductive material comprises copper, tungsten, aluminum, silver, and combinations thereof, or the like, thereby forming the contacts 210 as illustrated in FIG. 2A.

One or more inter-metal dielectric (IMD) layers 212 and the associated metallization layers (not shown) are formed over the ILD layer 208. Generally, the one or more IMD layers 212 and the associated metallization layers are used to interconnect the electrical circuitry 204 to each other and to provide an external electrical connection. The IMD layers 212 may be formed of a low-K dielectric material, such as FSG formed by PECVD techniques or high-density plasma CVD (HDPCVD), or the like, and may include intermediate etch stop layers. Contacts 214 are provided in the uppermost IMD layer to provide external electrical connections.

It should be noted that one or more etch stop layers (not shown) may be positioned between adjacent ones of the dielectric layers, e.g., the ILD layer 208 and the IMD layers 212. Generally, the etch stop layers provide a mechanism to stop an etching process when forming vias and/or contacts. The etch stop layers are formed of a dielectric material having a different etch selectivity from adjacent layers, e.g., the underlying semiconductor substrate 202, the overlying ILD layer 208, and the overlying IMD layers 212. In an embodiment, etch stop layers may be formed of SiN, SiCN, SiCO, CN, combinations thereof, or the like, deposited by CVD or PECVD techniques.

Figure 3A:
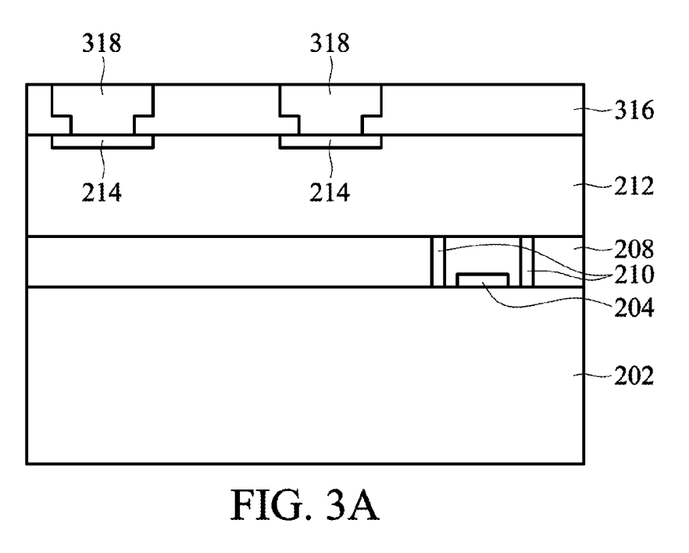
Figure 3B:
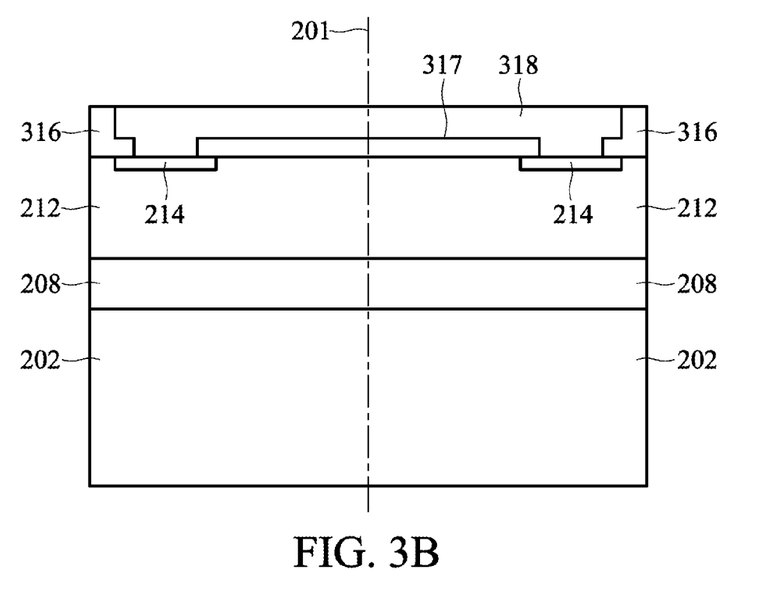

FIGS. 3A and 3B illustrate a passivation layer 316 formed over the contacts 214 and the uppermost IMD layer 212 to protect the underlying layers from various environmental contaminants in accordance with an embodiment. The passivation layer 316 may comprise one or more layers of dielectric material, such as SiN, a plasma-enhance oxide (PEOX), a plasma-enhanced SiN (PE-SiN), a plasma-enhanced undoped silicate glass (PE-USG), or the like. The passivation layer 316 is patterned to provide an opening over the contacts 214 using, for example, a dual damascene process. As illustrated in FIG. 3B, the passivation layer 316 is further patterned to form a trench 317 extending from the contacts 214 to the scribe line 201. In an embodiment, the passivation layer 316 is formed using CVD or PVD process and has a thickness of about 1,000 Å to about 30,000 Å, and the trenches may have a width of about 5 µm to about 10 µm and a depth of about 800 Å to about 30,000 Å.

Thereafter, the trenches formed in the pas sivation layer 316 may be filled with a conductive material, thereby forming traces 318 as part of a post-passivation interconnect layer. The traces may be formed of any suitable conductive material, including Cu, Ni, Pt, Al, Ag, combinations thereof, or the like, and may be formed through any number of suitable techniques, including PVD, CVD, electrochemical deposition (ECD), molecular beam epitaxy (MBE), atomic layer deposition (ALD), electroplating, and the like. It should be noted that in some embodiments, such as those that deposit a conformal layer over the entire surface of the wafer (e.g., PVD and CVD), it may be desirable to perform an etching or planarization process (e.g., a chemical mechanical polishing (CMP)) to remove excess conductive material from the surface of the passivation layer 316.

Figure 4A:
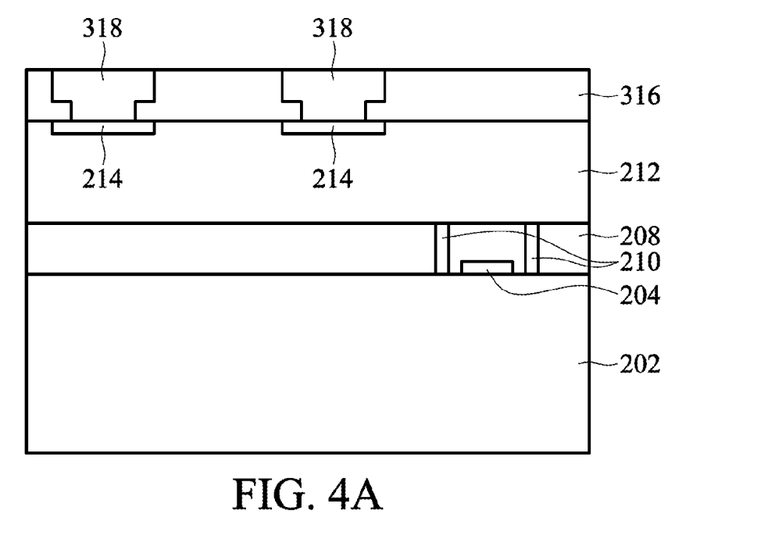
Figure 4B:
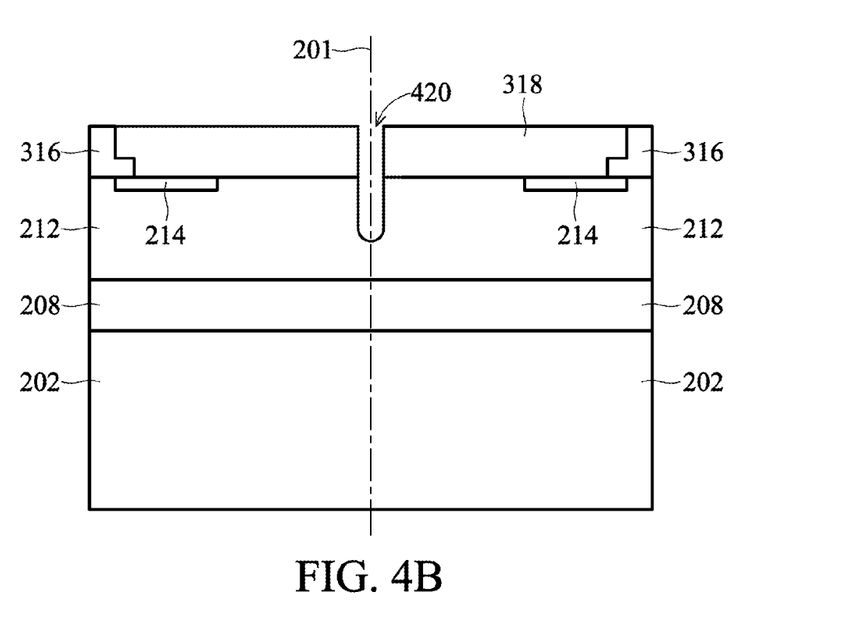

FIGS. 4A and 4B illustrate forming a groove 420 in along the scribe line 201 in accordance with an embodiment. The groove 420 exposes and terminates a portion of the traces 318 at the scribe line 201. The exposed portions of the traces 318 may have a thickness of about 1,200 Å to about 35,000 Å and will act as die edge contacts as discussed in greater detail below. In an embodiment, the groove 420 extends for a depth at least as great as the thickness of the traces 318. The grooves may be formed, for example, by laser grooving. It has been found that laser grooving allows for grooves to be formed in the passivation layer 316 as well as melt the trace material (e.g., copper), thereby creating an exposed edge of the traces 318 and forming die edge contacts.

Figure 5A:
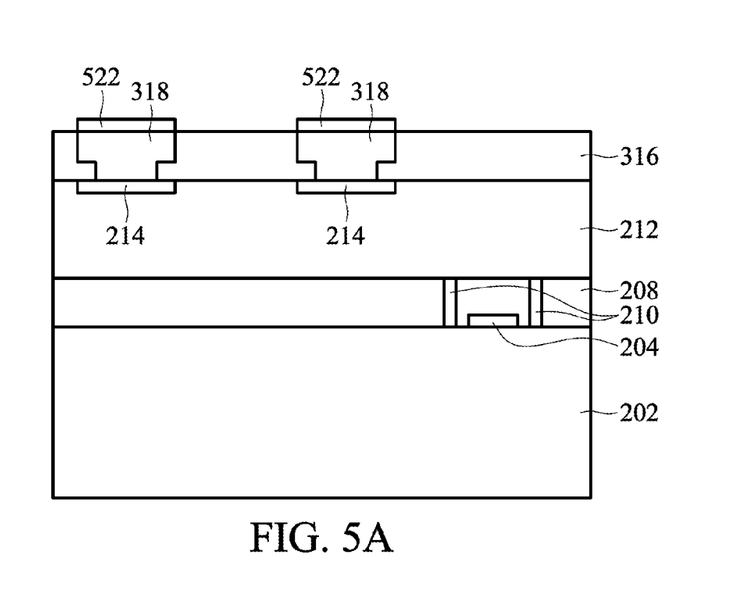
Figure 5B:
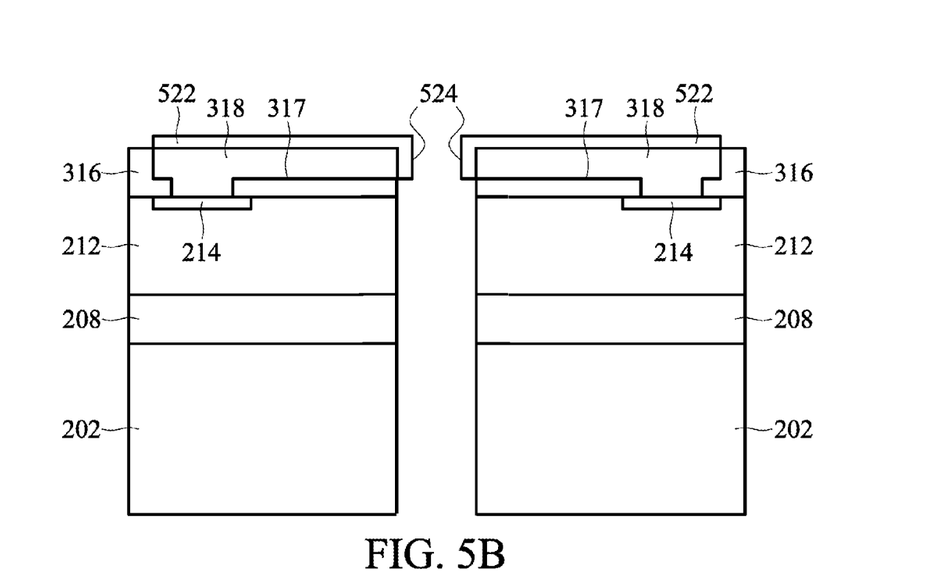

FIGS. 5A and 5B illustrate the substrate 202 after a singulation process and formation of a finish layer 522 formed over the surface of the traces 318. In an embodiment, the finish layer 522 includes a nickel layer directly on and contacting the traces 318. Optionally, additional layers may be formed, such that the finish layer 522 may be an electroless nickel immersion gold (ENIG), a nickel electroless palladium immersion gold (ENEPIG), or a nickel palladium layer. The formation methods of finish layer 522 include ECP, electroless plating, and the like.

In an embodiment, the finish layer 522 protrudes out from the surface of the die edge as illustrated in FIGS. 5A and 5B. This allows electrical contact to be easily made. In an embodiment, the finish layer 522 protrudes out from the die edge from about 100 Å to about 5,000 Å. It should be noted that in embodiments in which a larger protrusion is desired, additional conductive material, the same as or different from the material of which the traces 318 are formed, may be deposited over the traces 318. For example, in embodiments in which the traces 318 are formed of copper, additional copper material may be placed on the traces 318 using, for example, an ECP process.

The traces 318/finish layer 522 form die edge contacts 524. Optionally, a backside thinning process may be performed and a cap layer may be placed on a surface of the dies. The cap layer may also act as a heat sink.

Figure 6:
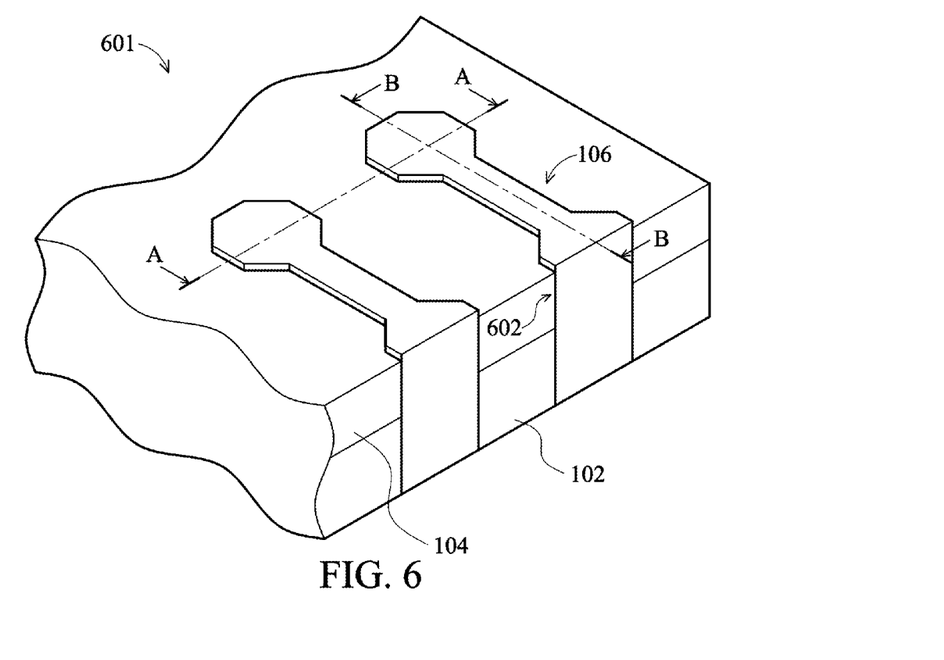
FIG. 6 is a perspective view of an integrated circuit die having die edge contacts in accordance with another embodiment.

FIG. 6 is a perspective view of a portion of a die 601 in accordance with an embodiment. The embodiment illustrated in FIG. 6 is similar to the embodiment illustrated in FIG. 1, wherein like reference numerals refer to like elements, except that the die 601 includes die edge contacts 602 extending completely through the die 601. As explained in greater detail below, the die edge contacts 602 are formed using a through-substrate via and sawing or singulating the die through the through-substrate via.

FIGS. 7A-9B illustrate various intermediate views of a method of forming a structure such as that illustrated in FIG. 6 in accordance with an embodiment. The "A" Figures of FIGS. 7A-9A are taken along the A-A line of FIG. 6, and the "B" Figures of FIGS. 7B-9B are taken along the B-B line of FIG. 6. It should be noted that the "B" Figures illustrate two adjacent dies to better illustrate embodiments discussed herein, wherein a dotted line 201 represent a scribe line between the two adjacent dies. Like reference numerals used in FIGS. 2A-5B and FIGS. 7A-9B refer to like elements, and these elements will not be discussed in greater detail herein.

Figure 7A:
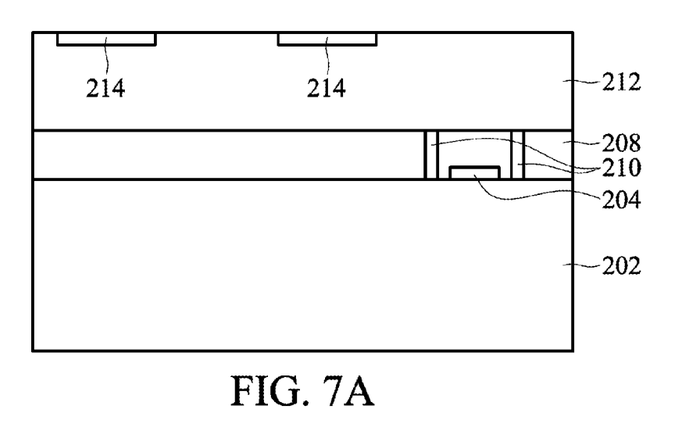
Figure 7B:
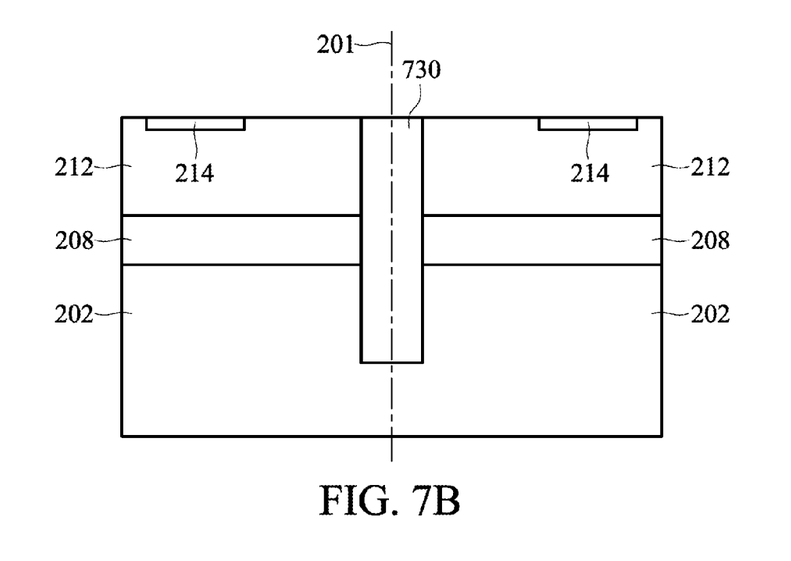

Referring first to FIGS. 7A-7B, there is shown, a portion of a substrate 202, similar to that discussed above, wherein like reference numerals refer to like elements, having a through-substrate substrate via 730 formed therein. The through-substrate via 730 may be formed by any suitable technique and of any suitable material(s). For example, the through-substrate via 730 may be formed by etching a via partially through the substrate 202 or drilling a via partially through the substrate 202 as illustrated in FIGS. 7A-7B. A conductive material, such as Al, Cu, other metals, alloys, doped polysilicon, combinations thereof, or the like, is formed to fill the via. As will be explained in greater detail below, the through-substrate via 730 will be sawed through to create die edge contacts. In an embodiment, the through-substrate via 730 has a diameter from about 3,000 Å to about 40,000 Å.

In another technique, the through-substrate via 730 may be formed by etching a via partially through the substrate and depositing a dielectric layer in the via. In this embodiment, the dielectric layer within the via is removed after the backside of the substrate is thinned, and a conductive material is re-deposited within the via. Other embodiments may also be used. Furthermore, the through-substrate via 730 may have a liner, such as a barrier layer, preferably formed of a dielectric such as an oxide, nitride, or the like.

Figure 8A:
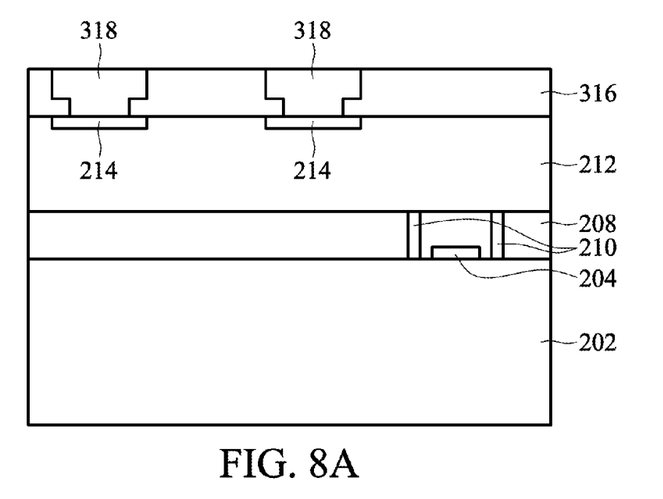
Figure 8B:
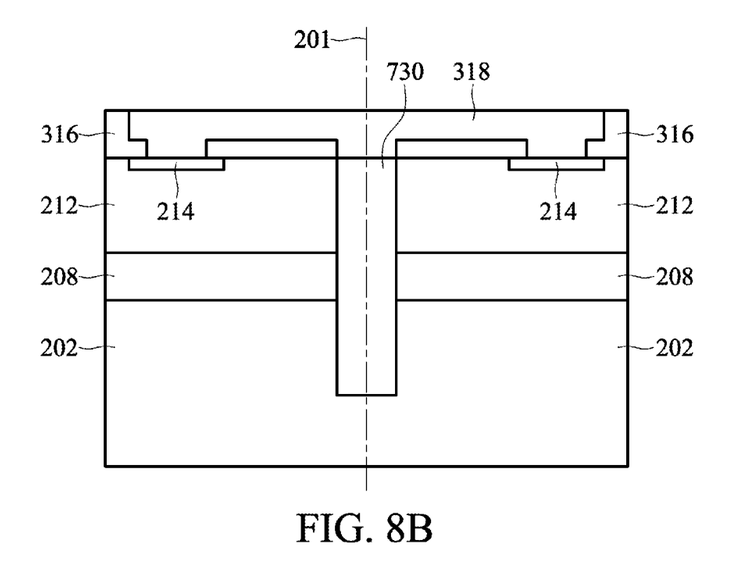

FIGS. 8A and 8B illustrate the passivation layer 316 formed over the substrate 202. The passivation layer 316 may be formed of similar materials using similar processes as discussed above with reference to FIGS. 3A and 3B, except that in this embodiment the passivation layer 316 is patterned to also expose the through-substrate via 730. Trenches formed in the passivation layer 316 may be filled with a conductive material to form the traces 318.

Figure 9A:
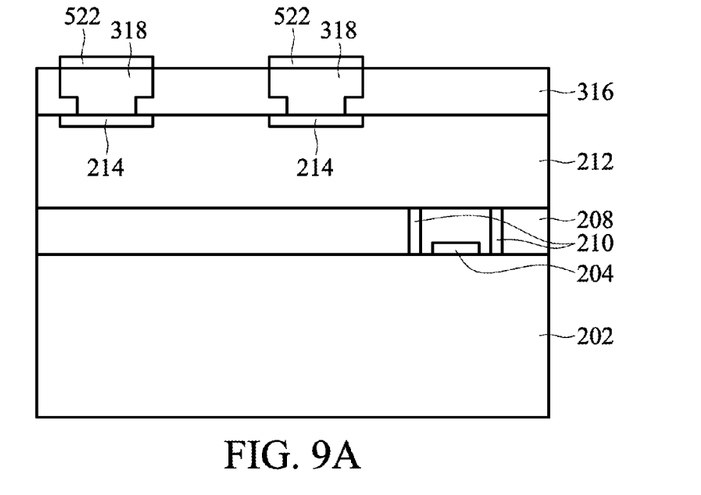
Figure 9B:
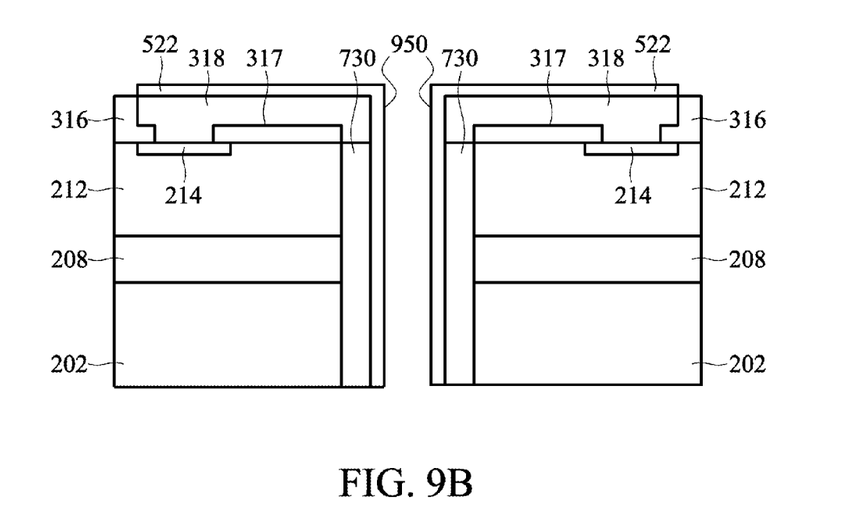

FIGS. 9A and 9B illustrate the substrate 202 after a singulation process and a wafer thinning process. The wafer thinning process may be performed to expose the through-silicon via 730. After singulation, the finish layer 522 may be formed as discussed above with reference to FIG. 5. In an embodiment, the finish layer 522 protrudes out from the surface of the die edge as illustrated in FIGS. 9A and 9B, thereby allowing for a raised electrical contact. As illustrated in FIGS. 9A and 9B, the through-substrate via 730/trace 318/finish layer 522 form die edge contacts 950 extending an entire thickness of the die. Optionally, a cap layer may be placed on a surface of the dies. The cap layer may also act as a heat sink. In another embodiment, the through-substrate via 730, and hence the die edge contacts 950, do not extend completely through the die, but rather only extends partially through the substrate 202 after thinning.

Figure 10:
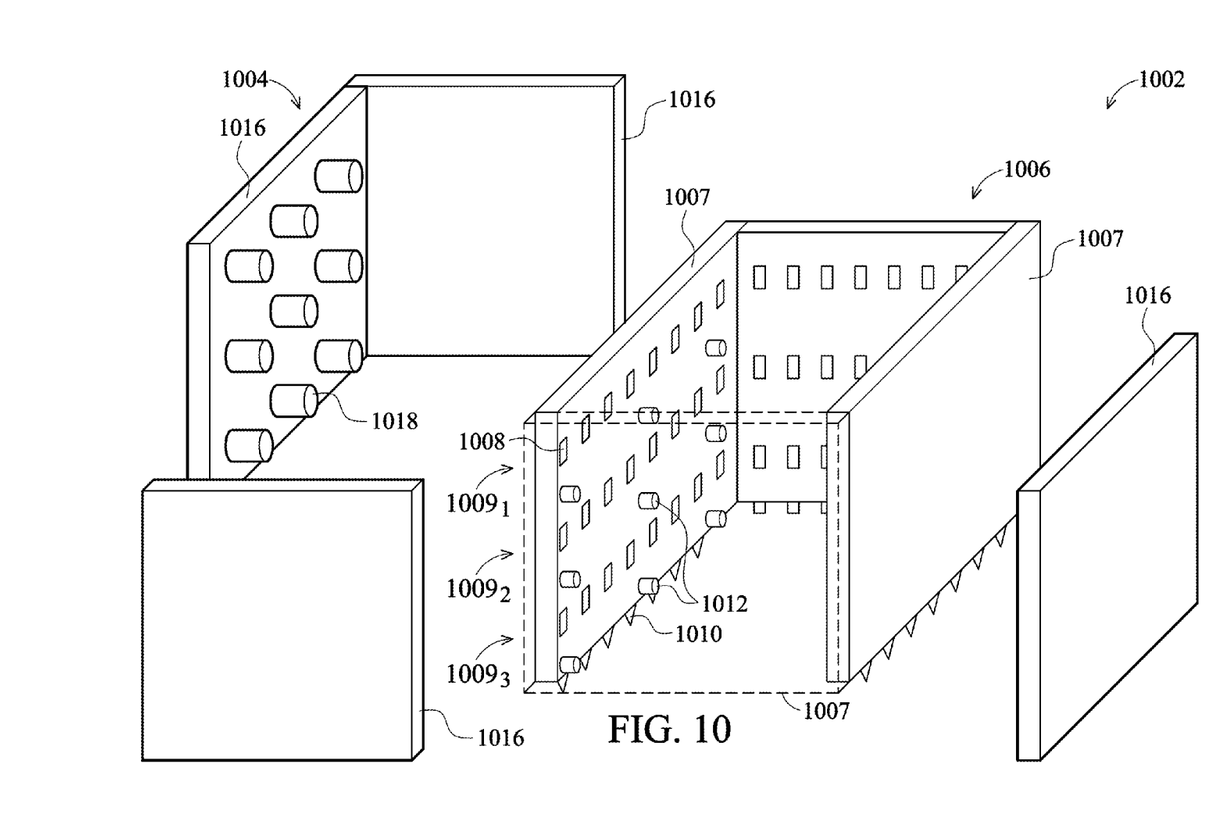
FIG. 10 is a perspective view of a multi-die package for integrated circuit dies having die edge contacts in accordance with another embodiment.
Figure 13:
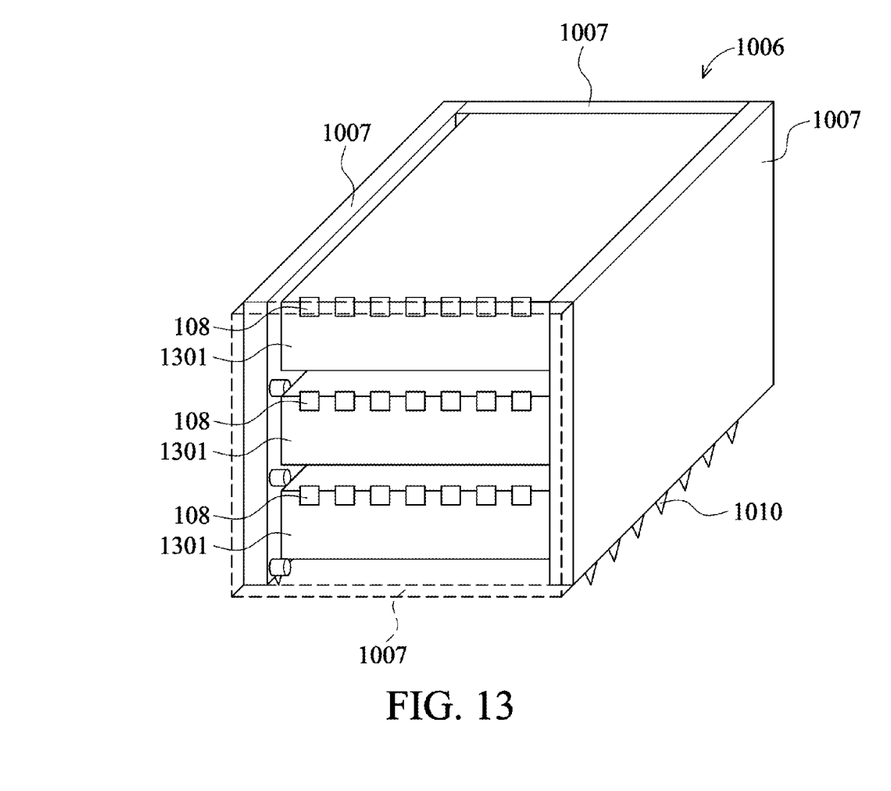
FIG. 13 is a perspective view of a multi-die package with a plurality of integrated circuit dies attached thereto.

FIG. 10 illustrates a multi-die package 1002 that may be used to package a plurality of dies in accordance with an embodiment. The multi-die package 1002 includes an outer shell 1004 and an inner connection structure 1006. Generally, the inner connection structure 1006 comprises one or more walls or substrates 1007 upon which the individual dies, such as dies 101 and 601 discussed above with reference to FIGS. 1 and 6, respectively, will be attached. In the embodiment illustrated in FIG. 10, the inner connection structure 1006 comprises four walls or substrates 1007, wherein one or more of the substrates have die supports 1012 along an inner surface of the inner connection structure 1006 to support the individual dies inserted into the inner connection structure 1006. The wall 1007 on the end is shown as a dotted line to provide a better view of the interior structure of the inner connection structure 1006. Each of the walls may be individually fabricated in wafer form and assembled using glue or other adhesive to hold the walls together after sawing. In the example illustrated in FIG. 10, the inner connection structure 1006 is configured to have three slots $1009_1$, $1009_2$, and $1009_3$. Each of the three slots $1009_1$, $1009_2$, and $1009_3$ may be configured to receive the same type of die, e.g., memory, or dies having a different function, e.g., one of the dies may be a processor while another one of the dies may be memory, to create a system-in-a-package (SIP). Three slots are shown for illustrative purposes only, and other embodiments may have more or fewer slots. FIG. 13 illustrates three dies 1301 inserted into the inner connection structure 1006.

Contacts 1008 along an interior surface of the inner connection structure 1006 provide an electrical connection to die edge contacts, such as the die edge contacts 524, 950 (see FIGS. 5 and 9). The contacts 1008 are electrically coupled to one or more external contacts 1010 along a bottom edge of the inner connection structure 1006. The external contacts 1010 may include raised contacts such as conductive posts, solder balls/bumps, combinations thereof, or the like for electrically coupling the inner connection structure 1006 to a printed circuit board, packaging substrate, high-density interconnect structure, or the like.

The outer shell 1004 comprises walls or substrates 1016 positioned along an outer surface of the inner connection structure 1006 and acts to protect the inner connection structure 1006. The outer shell 1004 may also act as a heat sink to aid in the dissipation of heat produced by the plurality of dies during operation. The walls 1016 may be individually fabricated and then assembled using glue or other adhesive. Micro-suspension rods 1018 protruding from an inner surface of the outer shell 1004 act to buffer the inner connection structure 1006 for thermal expansion as well as acting as a heat transfer mechanism between the inner connection structure 1006 and the outer shell 1004.

Figure 11:
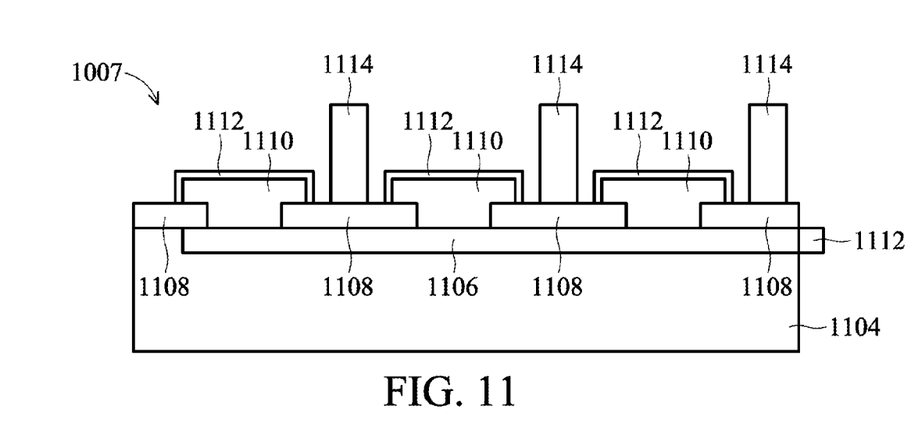
FIG. 11 illustrates a wall of an inner connection structure of the multi-die package in accordance with an embodiment.

FIG. 11 illustrates a cross section of the wall 1007 that may be utilized to form the inner connection structure 1006 of the multi-die package 1002 or a packaging substrate for receiving one or more integrated circuit dies such as those discussed above with reference to FIGS. 1-9B. In an embodiment, the wall 1007 includes a substrate 1104 having a metallization layer 1106 formed thereon. The substrate 1104 may comprise, for example, bulk silicon, doped or undoped, or an active layer of a semiconductor-on-insulator (SOI) substrate. In other embodiments, the substrate 1104 may comprise a printed circuit board, a laminate substrate, or the like. In an embodiment, it may be desirable to utilize a substrate formed of a material, e.g., silicon, having a similar coefficient of thermal expansion (CTE) as the substrates of the integrated circuit dies to be placed in the multi-die package. The substrate 1104 may include one or more dielectric layers.

The metallization layer 1106 may be formed of any suitable conductive material, including Cu, Ni, Pt, Al, Ag, combinations thereof, or the like, and may be formed through any number of suitable techniques, including PVD, CVD, ECD, MBE, ALD, electroplating, and the like.

A passivation layer 1108 may be formed and patterned over a surface of the substrate 1104 such that portions of the metallization layer 1106 corresponding to contact areas for the die edge contacts are exposed. The passivation layer 1108 may comprise one or more layers of dielectric material, such as SiN, PEOX, PE-SiN, PE-USG, a polymer, or the like.

Thereafter, raised contacts 1110, corresponding to the contacts 1008 of FIG. 10, are formed in the openings formed in the passivation layer 1108. The raised contacts 1110 may be formed of one or more layers of any suitable conductive material, including Cu, Ni, Pt, Al, Ag, combinations thereof, or the like, and may be formed through any number of suitable techniques, including PVD, CVD, ECD, MBE, ALD, electroplating, and the like. A finish layer 1112, such as a nickel layer, an ENIG layer, an ENEPIG layer, or the like. The finish layer 1112 also acts to create a raised contact along the substrate edge as illustrated in FIG. 11. In an embodiment, the raised contacts 1110 have a height of about 2,000 Å to about 20,000 Å.

Die supports 1114, corresponding to the die supports 1012 of FIG. 10, are formed between rows of the raised contacts 1110 and act as an alignment and rest for inserting dies into the inner connection structure 1006. The die supports 1114 may be formed of a dielectric material, such as $SiO_2$, glass, quartz, which could be attached by glue with print method, and may be formed by powder forming; or a conductive material, such as metallic balls or cubic structures, which could be attached by glue with print method, and may be formed by powder metallurgy. In an embodiment, the die supports 1114 have a height of about 300 μm to about 5,000 μm and a width of about 300 μm to about 5,000 μm.

It should be noted that FIG. 11 illustrates a single metallization layer connected to each of the raised contacts 1110 for illustrative purposes only. In other embodiments, the metallization layer may be formed such that the raised contacts are routed to different external contacts.

Figure 12:
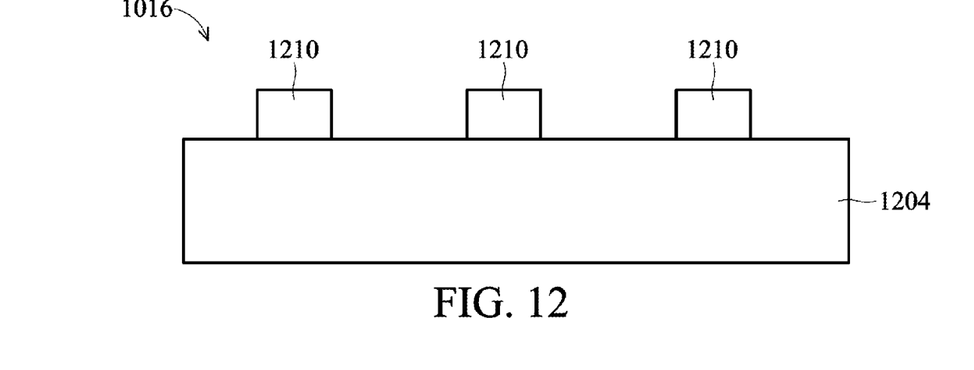
FIG. 12 illustrates a wall of an outer shell of the multi-die package in accordance with an embodiment.

FIG. 12 illustrates a cross section of the wall 1016 that may be utilized to form the outer shell 1004 of FIG. 10. The wall 1016 includes a substrate 1204 having micro-suspension rods 1210 protruding therefrom. The substrate 1204 may include any suitable substrate, including a silicon substrate, a metallic substrate, a ceramic substrate, or the like. In an embodiment the substrate 1204 has a thickness of about 1 mm. The micro-suspension rods 1210 may be formed of silicone rubber, micro metal spring, or the like.

Any suitable process, such as those processes used for forming integrated circuits, interposers, and/or the like, may be used to form the structures discussed above and will not be discussed in greater detail herein. As one of ordinary skill in the art will realize, the above description provides a general description of the features of an embodiment and that numerous other features may be present. For example, other circuitry, liners, barrier layers, under-bump metallization configurations, and the like, may be present. For example, the inner connection structure 1006 may include active and/or passive electrical elements as well as metallization routing lines. The above description is meant only to provide a context for embodiments discussed herein and is not meant to limit the disclosure or the scope of any claims to those specific embodiments.

A semiconductor device and a method of forming a semiconductor device utilizing die edge contacts are provided. An integrated circuit die has a passivation layer having a conductive trench extending from a contact to a die edge, thereby forming a die edge contact. In an embodiment, a through-substrate via may be formed along a scribe line under the trench such that when the dies are singulated through the through-substrate via, the die-edge contact is larger. The integrated circuit die may be attached to a packaging substrate using the die edge contact such that the packaging substrate has a major surface perpendicular to a major surface of the integrated circuit die. The packaging substrate may include edge contacts for connecting to another substrate, such as a printed circuit board, another packaging substrate, a high-density interconnect, or the like.

In an embodiment, a plurality of packaging substrates are arranged along the sides of the integrated circuit die and may accommodate a plurality of integrated circuit dies in a multi-die package. In an embodiment, the multi-die package includes an inner connection structure and an outer shell. The inner connection structure provides electrical connections between various ones of the integrated circuit dies and between the integrated circuit dies and another substrate.

Other embodiments are disclosed.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor structure comprising:
   an integrated circuit substrate having a contact pad formed thereon;
   a passivation layer formed over the integrated circuit substrate, the passivation layer exposing at least a portion of the contact pad and having a trench from the contact pad to an outermost edge of the passivation layer; and
   a conductive material filling the trench of the passivation layer to form a die-edge contact.

2. The semiconductor structure of claim 1, further comprising a through-substrate via on the edge of the substrate such that the die-edge contact comprises the through-substrate via.

3. The semiconductor structure of claim 1, further comprising an inner connection structure, the inner connection structure having a plurality of inner connection substrates perpendicular to the integrated circuit substrate, at least one of the inner connection substrates having a contact pad electrically coupled to the die-edge contact.

4. The semiconductor structure of claim 3, wherein the inner connection structure comprises die supports.

5. The semiconductor structure of claim 3, wherein at least one of the inner connection substrates comprises electrical contacts along an edge.

6. The semiconductor structure of claim 3, further comprising an outer shell, the outer shell having a plurality of outer shell substrates on a side of the inner connection structure opposite from the integrated circuit substrate.

7. The semiconductor structure of claim 6, further comprising micro-suspension rods interposed between the inner connections structure and the outer shell.

8. A semiconductor structure comprising:
an integrated circuit substrate;
a passivation layer overlying the integrated circuit substrate;
a conductive line formed in the passivation layer extending to an outermost perimeter of the passivation layer in a plan view; and
a finish layer over the conductive line, the conductive line and the finish layer extending to a sidewall of the passivation layer, thereby forming a die-edge contact.

9. The semiconductor structure of claim 8, further comprising a through-substrate via on the edge of the integrated circuit substrate such that the die-edge contact comprises the through-substrate via.

10. The semiconductor structure of claim 8, further comprising an inner connection structure, the inner connection structure having a plurality of inner connection substrates, at least one of the inner connection substrates having a contact pad electrically coupled to the die-edge contact.

11. The semiconductor structure of claim 10, wherein the inner connection structure comprises die supports.

12. The semiconductor structure of claim 10, wherein at least one of the inner connection substrates comprises electrical contacts along an edge.

13. The semiconductor structure of claim 10, further comprising an outer shell, the outer shell having a plurality of outer shell substrates on a side of the inner connection structure opposite from the integrated circuit substrate.

14. The semiconductor structure of claim 13, further comprising micro-suspension rods interposed between the inner connections structure and the outer shell.

15. A semiconductor structure comprising:
one or more integrated circuit substrates, each of the one or more integrated circuit substrates having a passivation layer and conductive lines in the passivation layer extending from respective contact pads to an outermost edge of respective ones of the integrated circuit substrates, thereby forming die edge contacts; and
an inner connection structure having one or more inner connection substrates, at least one of the inner connection substrates having electrical contacts formed thereon, wherein the one or more integrated circuit substrates are positioned within the inner connection structure such that the die edge contacts are electrically coupled to respective ones of the electrical contacts of the inner connection substrates.

16. The semiconductor structure of claim 15, wherein the inner connection structure further comprises external contacts along an edge of at least one of the inner connection substrates.

17. The semiconductor structure of claim 15, wherein the inner connection structure further comprises one or more die supports protruding from the inner connection substrates.

18. The semiconductor structure of claim 15, further comprising an outer shell on an opposite side of the inner connection structure from the one or more integrated circuit substrates and one or more micro-suspension rods interposed between the outer shell and the inner connection structure.

19. The semiconductor structure of claim 15, wherein the die edge contacts comprise a through-substrate via.

20. The semiconductor structure of claim 15, wherein the die edge contacts comprise an exposed portion of a trench in the integrated circuit dies.

\* \* \* \* \*